(12) United States Patent
Hsu

(10) Patent No.: US 11,450,635 B2
(45) Date of Patent: Sep. 20, 2022

(54) ARRANGEMENT OF BOND PADS ON AN INTEGRATED CIRCUIT CHIP

(71) Applicant: Changxin Memory Technologies, Inc., Anhui (CN)

(72) Inventor: Chia-Chi Hsu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/175,275

(22) Filed: Feb. 12, 2021

(65) Prior Publication Data

US 2021/0167028 A1 Jun. 3, 2021

Related U.S. Application Data

(63) Continuation of application No. PCT/CN2019/103361, filed on Aug. 29, 2019.

(30) Foreign Application Priority Data

Aug. 31, 2018 (CN) .......................... 201811011188.4
Aug. 31, 2018 (CN) ......................... 201821427834.0

(51) Int. Cl.
*H01L 23/00* (2006.01)

(52) U.S. Cl.
CPC .............. *H01L 24/06* (2013.01); *H01L 24/05* (2013.01); *H01L 2224/05012* (2013.01); *H01L 2224/06163* (2013.01)

(58) Field of Classification Search
CPC ...................... H01L 24/06; H01L 24/05; H01L 2224/05012; H01L 2224/06163; H01L 2224/0392; H01L 2224/05552; H01L 2224/05553; H01L 2224/06051; H01L 2224/06133; H01L 2224/06153
See application file for complete search history.

(56) References Cited

U.S. PATENT DOCUMENTS 6,538,336 B1    3/2003 Seeker et al.
9,184,151 B2 *  11/2015 Siang ...................... H01L 24/48
(Continued)

FOREIGN PATENT DOCUMENTS

CN    104704621 A    6/2015
CN    104777637 A    7/2015
(Continued)

OTHER PUBLICATIONS

PCT International Search Report and the Written Opinion dated Dec. 4, 2019, issued in related International Application No. PCT/CN2019/103361 (8 pages).

*Primary Examiner* — Mamadou L Diallo
(74) *Attorney, Agent, or Firm* — Sheppard Mullin Richter & Hampton LLP

(57) ABSTRACT

The embodiments of the present invention discloses an arrangement of bond pads on an integrated circuit chip. The integrated circuit chip includes: a first row of bond pads; and a second row of bond pads, wherein bond pads in the first row are positioned alternately with bond pads in the second row, and a short side of the bond pads in the first row and the second row is parallel to a long side of the integrated circuit chip. With this arrangement of bond pads on the integrated circuit chip, the bond pads may occupy a reduced area of a surface of the integrated circuit chip.

15 Claims, 10 Drawing Sheets

(56) References Cited

U.S. PATENT DOCUMENTS

| | | | |
|---|---|---|---|
| 9,318,454 B2 | 4/2016 | Matsui et al. | |
| 10,162,440 B2 | 12/2018 | Jin | |
| 10,303,017 B2 | 5/2019 | Park et al. | |
| 10,825,760 B2* | 11/2020 | Nakamura | H01L 24/49 |
| 10,923,437 B2* | 2/2021 | Tomita | H01L 24/06 |
| 11,056,435 B2* | 7/2021 | Ho | H01L 23/49838 |
| 2009/0273097 A1* | 11/2009 | Hedler | H01L 22/32 |
| | | | 257/E21.585 |
| 2010/0084756 A1* | 4/2010 | Dirks | H01L 23/49541 |
| | | | 257/E23.141 |
| 2010/0177227 A1* | 7/2010 | Cieslinski | H04N 5/378 |
| | | | 348/E5.091 |
| 2012/0241208 A1* | 9/2012 | Petersen | H01L 23/49838 |
| | | | 174/250 |
| 2013/0284885 A1* | 10/2013 | Chen | H01L 25/16 |
| | | | 250/208.1 |
| 2014/0252635 A1* | 9/2014 | Tran | H01L 24/08 |
| | | | 257/773 |
| 2014/0346656 A1* | 11/2014 | Eugene Lee | H01L 23/3107 |
| | | | 257/676 |
| 2015/0214167 A1* | 7/2015 | Bhooshan | H01L 24/06 |
| | | | 257/784 |
| 2017/0373024 A1* | 12/2017 | Graf | H01L 23/49838 |

FOREIGN PATENT DOCUMENTS

| | | | | |
|---|---|---|---|---|
| CN | 108122882 A | | 6/2018 | |
| CN | 109192712 A | | 1/2019 | |
| CN | 208655618 U | | 3/2019 | |
| CN | 111863759 A | * | 10/2020 | H01L 23/488 |
| WO | WO-2017183352 A1 | * | 10/2017 | H01L 23/49811 |

\* cited by examiner

ARRANGEMENT OF BOND PADS ON AN INTEGRATED CIRCUIT CHIP

CROSS-REFERENCE TO RELATED APPLICATIONS

This application is a continuation application of International Patent Application No. PCT/CN2019/103361, filed on Aug. 29, 2019, which is based on and claims priority to and benefits of Chinese Patent Applications No. 201811011188.4 and No. 201821427834.0, both filed with the State Intellectual Property Office (SIPO) of the People's Republic of China on Aug. 31, 2018. The entire content of the above-identified applications are incorporated herein by reference.

TECHNICAL FIELD

The present invention pertains to the field of semiconductor technology and, more particularly, to an arrangement of bond pads on an integrated circuit chip.

BACKGROUND

With the evolution of semiconductor integrated circuit (IC) chip technology, IC chips have been shrunk to such a size that one row of bond pads are no longer sufficient for normal IC chip functionalities. Therefore, it is necessary to arrange two rows of bond pads on the surface of the IC chip. However, currently, such an arrangement contains bond pads that are arranged in upper and lower rows aligned with each other. This arrangement leads to the bonding bond pads taking up a large portion of the IC chip surface, which reduces the number of IC chips yielded from wafers of the same size.

It is to be noted that the above information disclosed in this Background section is only for enhancement of understanding of the background of the invention. Therefore, it does not necessarily constitute prior art known to a person of ordinary skill in the art.

SUMMARY OF THE INVENTION

In an aspect of the present invention, an arrangement of bond pads on an IC chip including a first row of bond pads and a second row of bond pads. Bond pads of the first row may be positioned alternately with bond pads of the second row, and short sides of the bond pads of the first row and the bond pads of the second row may be parallel to long sides of the IC chip.

In one embodiment of the present invention, the IC chip may have a first side and a second side that are parallel to a first direction and a third side and a fourth side that are parallel to a second direction, and lengths of the first side and the second side of the IC chip are greater than lengths of the third side and the fourth side of the IC chip. Each bond pad of the first row and the second row may have a first side and a second side that are parallel to the second direction and a third side and a fourth side that are parallel to the first direction, and lengths of the first side and the second side of each bond pad are greater than the third side and the fourth side of each bond pad.

In one embodiment of the present invention, the fourth side of the bond pads of the first row may be spaced in the second direction from the third side of the bond pads of the second row by a distance greater than or equal to a first threshold.

In one embodiment of the present invention, neighboring bond pads in the first row may be spaced from each other in the first direction by a distance greater than or equal to a second threshold, and neighboring bond pads in the second row may be spaced from each other in the first direction by a distance greater than or equal to the second threshold.

In one embodiment of the present invention, the arrangement may further include a third row of bond pads adjacent to the second row, wherein bond pads of the third row may be positioned alternately with the bond pads of the second row.

In one embodiment of the present invention, the bond pads in the second row is positioned between two neighboring bond pads in the first row.

In one embodiment of the present invention, the bond pads in the second row may be positioned on a midline of two neighboring bond pads in the first row.

In one embodiment of the present invention, at least one of the bond pads may have at least one rounded corner.

In one embodiment of the present invention, the at least one rounded corner may be located on a side of a bond pad of the first row adjacent to the second row, or located on a side of a bond pad of the second row adjacent to the first row.

In one embodiment of the present invention, the at least one rounded corner may have a central angle greater than or equal to 30 degrees and less than 90 degrees.

In one embodiment of the present invention, at least one of the bond pads may have at least one chamfered corner.

In one embodiment of the present invention, the at least one chamfered corner may be located on a side of a bond pad of the first row adjacent to the second row, or located on a side of a bond pad of the second row adjacent to the first row.

In one embodiment of the present invention, the at least one chamfered corner may have a chamfer angle greater than or equal to 30 degrees and less than 90 degrees.

In one embodiment of the present invention, the at least one rounded corner may include a concave corner or a convex corner.

In one embodiment of the present invention, each bond pad comprises a plurality of bond pads.

In one embodiment of the present invention, a number of the plurality of bond pads in the first row is the same as or different than a number of the plurality of bond pads in the second row.

In one embodiment of the present invention, the first row comprises at least a first bond pad and a second bond pad, the first bond pad comprises a first number of a plurality of bond pads, the second bond pad comprises a second number of a plurality of bond pads, and the first number is the same as or different than the second number.

In one embodiment of the present invention, the second row comprises at least a third bond pad and a fourth bond pad, the third bond pad comprises a third number of a plurality of bond pads, the fourth bond pad comprises a fourth number of a plurality of bond pads, and the third number is the same as or different than the fourth number.

According to some embodiments of the present invention, by alternately positioning bond pads of at least two rows of bond pads on a surface of the IC chip, an overall area of the IC chip surface taken up by the bond pads can be reduced.

BRIEF DESCRIPTION OF THE DRAWINGS

Various objectives, features, and advantages of the present invention are described clearly in the following detailed description of embodiments in conjunction with the accompanying drawings. These figures are presented merely to illustrate and exemplify the present invention, and are not necessarily drawn to scale. Similar elements may have same or analogous reference numbers throughout the figures, in which.

DETAILED DESCRIPTION

The embodiments that demonstrate the features and advantages of the present invention will be described in detail in the following description. It is to be understood that various changes may be made to these disclosed embodiments without departing from the scope of the invention. The description and drawings are illustrative and do not limit the invention in any scope.

The following description of the various embodiments of the present invention may refer to the accompanying drawings which constitute a part of the invention. Shown in embodiments, the drawings illustrate various structures, systems, and steps that can implement various aspects of the invention. It is to be understood that other specific schemes of components, structures, devices, systems, and steps can also be used, and structural and functional modifications can be made without departing from the scope of the invention.

Figure 1:
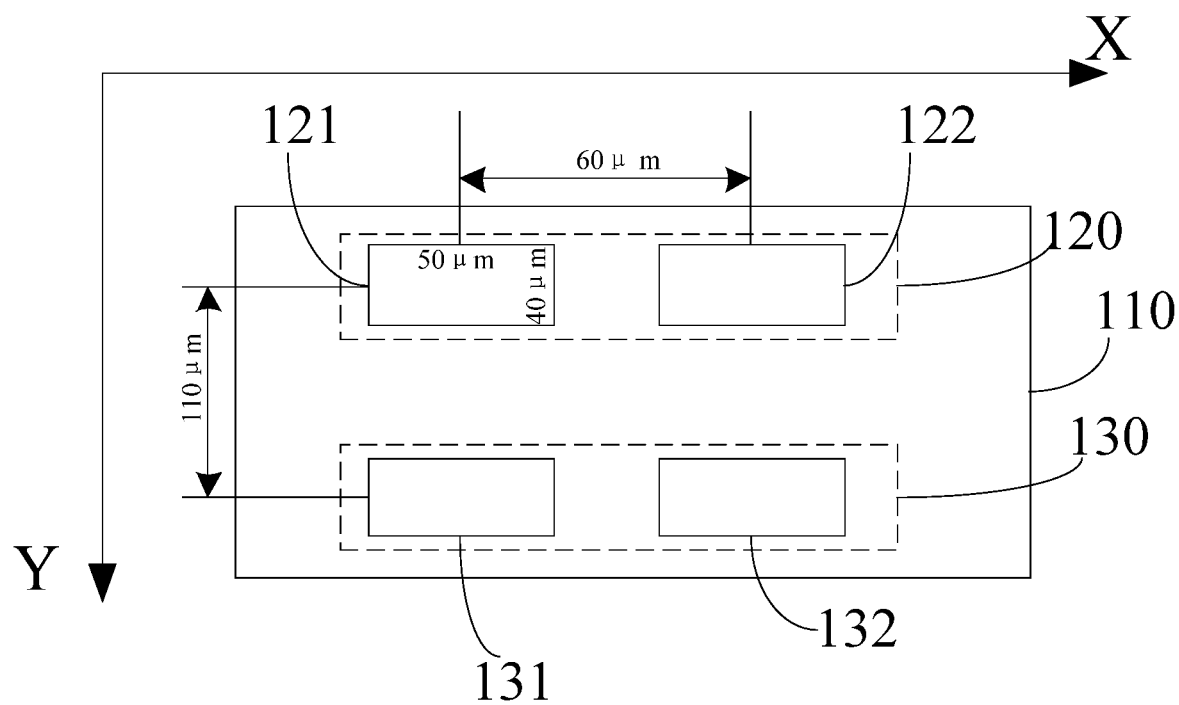
FIG. 1 schematically illustrates an arrangement of bond pads on an IC chip in relevant art.

FIG. 1 schematically illustrates an arrangement of bond pads on an IC chip in relevant art.

As shown in FIG. 1, an IC chip 110 in the relevant art has a surface on which a first row of bond pads 120 and a second row of bond pads 130 are arranged. The first row of bond pads 120 may include two bond pads 121 and 122, and the second row 130 may include two bond pads 131 and 132, as an example. As can be seen from the figure, in the relevant art, the bond pads of the first row of bond pads 120 are aligned with the respective bond pads of the second row of bond pads 130. That is, the bond pad 121 is aligned with the bond pad 131, and the bond pad 122 is aligned with the bond pad 132. Additionally, in the relevant art, long sides of the IC chip 110 and long sides of the bond pads (i.e., the side labeled with "50 µm" in the figure) are parallel to the X-axis, and short sides of the IC chip 110 and short sides of the bond pads (i.e., the side labeled with "40 µm" in the figure) are parallel to the Y-axis. For normal testing of the bond pads with a probe, it is necessary to satisfy a predefined space between neighboring bond pads in each row (e.g., the horizontal distance that is greater than or equal to 60 µm between centers of the bond pads 121 and 122 in FIG. 1) and a predefined space between adjacent rows (e.g., the vertical distance that is greater than or equal to 110 µm between centers of the bond pads 121 and 131 in FIG. 1). This arrangement, however, leads to a large area of the IC chip surface occupied by the bond pads, which reduces the number of IC chips yielded from the wafers.

For example, with the size given in FIG. 1, an area of the IC chip surface occupied by the four bond pads is $(50+60) \times (110+40) = 16500 \ \mu m^2$.

Figure 2:
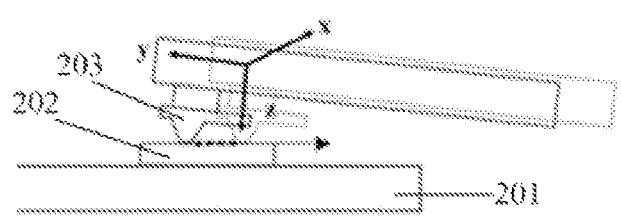
FIG. 2 is a schematic illustrating a probe in the relevant art.

FIG. 2 is a schematic illustrating a probe in the relevant art.

As shown in FIG. 2, a probe 203 is used to test bond pads 203 arranged on a substrate 201. However, restrained by the minimum bond pad-to-bond pad distance, such as the horizontal distance between the centers of the bond pads 121 and 122 that is required to be greater than or equal to 60 µm and the vertical distance between the centers of the bond pads 121 and 131 that is required to be greater than or equal to 110 µm in FIG. 1, and the capabilities of the existing probing and packaging techniques, the bond pad arrangement of FIG. 1 will lead to a low wafer yield.

In one embodiment of the present invention, an arrangement of bond pads on an IC chip may include a first row of bond pads and a second row of bond pads. Bond pads of the first row of bond pads are positioned alternately with bond pads of the second row of bond pads, and short sides of bond pads of the first and the second rows of bond pads are parallel to long sides of the IC chip. Compared to the conventional arrangement, in this embodiment, the bond pads in the two rows of the arrangement are positioned alternately with one another and are rotated by 90 degrees.

The bond pads in this arrangement may take up a smaller area of the IC chip surface, resulting in an increase in wafer yield.

It is to be noted that the IC chip has two parallel long sides and two parallel short sides, and each bond pad has two parallel long sides and two parallel short sides. In embodiments of the present invention, the long sides are longer than the short sides.

Figure 3:
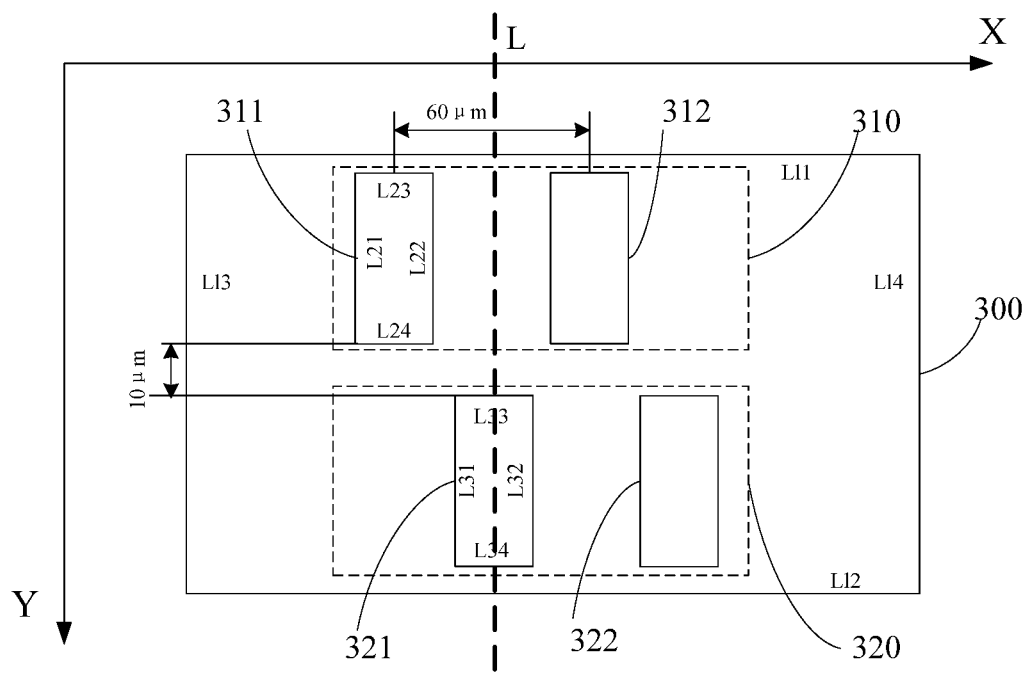
FIG. 3 schematically illustrates an arrangement of bond pads on an IC chip according to an embodiment of the present invention.

FIG. 3 schematically illustrates an arrangement of bond pads on an IC chip according to an embodiment of the present invention.

As shown in FIG. 3, according to this embodiment, the arrangement provided on an IC chip 300 may include a first row of bond pads 310 and a second row of bond pads 320. The first row of bond pads 310 may contain bond pads 311 and 312 and the second row of bond pads 310 may contain bond pads 321 and 322. The bond pads 311 and 312 are positioned alternately with the bond pads 321 and 322, such that, the bond pads in the first row 310 (e.g., the bond pads 311 and 312) and the bond pads in the second row 320 (e.g., the bond pads 321 and 322) do not align with each other along a direction (e.g., Y direction) perpendicular to the direction of the rows (e.g., X direction).

With continued reference to FIG. 3, the IC chip 300 may have a first side L11 and a second side L12, both are parallel to a first direction (e.g., the X-direction in the figure), and a third side L13 and a fourth side L14, both are parallel to a second direction (e.g., the Y-direction in the figure). The first side L1 land the second side L12 of the IC chip 300 may be longer than the third side L13 and the fourth side L14. Such that, the first side L11 and the second side L12 are the long sides of the IC chip 300, and the third side L13 and the fourth side L14 are the short sides of the IC chip 300.

In an embodiment of the present invention, the first direction may be perpendicular to the second direction.

In FIG. 3, each bond pad of the first row of bond pads 310 (e.g., a bond pad 311) may have a first side L21 and a second side L22, both are parallel to the Y-direction, and a third side L23 and a fourth side L24, both are parallel to the X-direction. The first side L21 and the second side L22 of the bond pad 311 may be longer than the third side L23 and the fourth side L24. That is, the first side L2 land the second side L22 are the long sides of the bond pad 311, and the third side L23 and the fourth side L24 are the short sides of the bond pad 311.

With further reference to FIG. 3, each bond pad of the second row of bond pads 320 (e.g., a bond pad 321) may have a first side L31 and a second side L32, both are parallel to the Y-direction, and a third side L33 and a fourth side L34, both are parallel to the X-direction. The first side L31 and the second side L32 of the bond pad 321 may be longer than the third side L33 and the fourth side L34. That is, the first side L31 and the second side L32 are the long sides of the bond pad 321, and the third side L33 and the fourth side L34 are the short sides of the bond pad 321. Compared to the arrangement in the relevant art shown in FIG. 1, the orientations of the bond pads according to this embodiment of the present invention are rotated by 90 degrees so that short sides of the bond pads are parallel to the long sides of the IC chip. This arrangement of the bond pads in one row alternately positioned with those in the other rows, can lead to a reduction of the IC chip area occupied by the bond pads.

In an embodiment of the present invention, the fourth sides of the bond pads of the first row of bond pads are spaced in the second direction from the third sides of the bond pads of the second row of bond pads by a distance that is greater than or equal to a first threshold. The first threshold may be, for example, greater than 0 μm.

As shown in FIG. 3, the Y-directional distance between the fourth side L24 of the bond pad 311 and the third side L33 of the bond pad 521 may be, but not limited to, 10 μm, as along as the distance ensures that the short sides of bond pads of the first row of bond pads do not contact with the short sides of bond pads of the second row of bond pads and allows a sufficient space for normal bond pad testing operation of the probe.

In an embodiment of the present invention, neighboring bond pads in the first row of bond pads are spaced from each other in the first direction by a distance greater than or equal to a second threshold, and neighboring bond pads in the second row of bond pads are spaced from each other in the first direction by a distance greater than or equal to the second threshold. In embodiments of the present invention, the second threshold may be, but not limited to, 60 μm.

For example, the first side L21 and the second side L22 of the bond pad 311 and the first side L31 and the second side L32 of the bond pad 321 are 50 μm, and the third side L23 and the fourth side L24 of the bond pad 311 and the third side L33 and the fourth side L34 of the bond pad 321 are 40 μm. The horizontal distance between the centers of the bond pads in each row is 60 μm, and the vertical distance between adjacent short sides of the bond pads in the two rows is 10 μm, and an area of the IC chip surface occupied by these four bond pads, as shown in FIG. 1, is $(60+40+30) \times (10+(50 \times 2)) = 14300\ \mu m^2$, which is less than $16500\ \mu m^2$.

It is to be noted that the above data are exemplary, and the actual side lengths of the bond pads may vary depending on the real applications.

In an embodiment of the present invention, the IC chip may be a bare die, i.e., in its unpackaged form.

In an embodiment of the present invention, the IC chip may be, but not limited to, a dynamic random access memory (DRAM) device.

Figure 4:
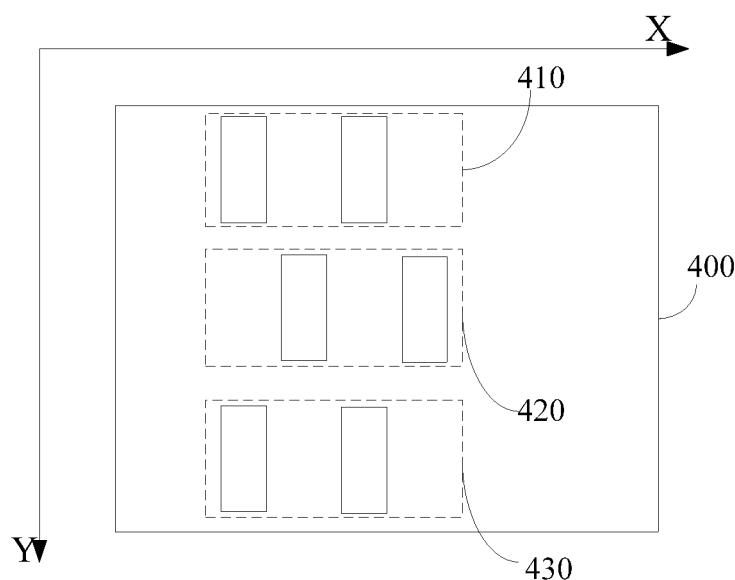
FIG. 4 schematically illustrates an arrangement of bond pads on an IC chip according to another embodiment of the present invention.

FIG. 4 schematically illustrates an arrangement of bond pads on an IC chip according to another embodiment of the present invention.

In addition to a first row of bond pads 410 and a second row of bond pads 420, different from FIG. 3, in this embodiment, an IC chip 400 includes a third row of bond pads 430. The bond pads of the third row of bond pads 430 are positioned alternately with the bond pads of the second row of bond pads 420, such that, the bond pads in the third row 430 and the bond pads in the adjacent row (e.g., the second row 420) do not align with each other along a direction (e.g., Y direction) perpendicular to the direction of the rows (e.g., X direction).

It is to be noted that, in arrangements according to other embodiments of the present invention, the numbers of rows of bond pads may be more and determined according to the read needs. The embodiments of the present invention is not limited to any particular number of rows of bond pads, as long as the bond pads in any row are positioned alternately from those in adjacent rows.

Figure 5:
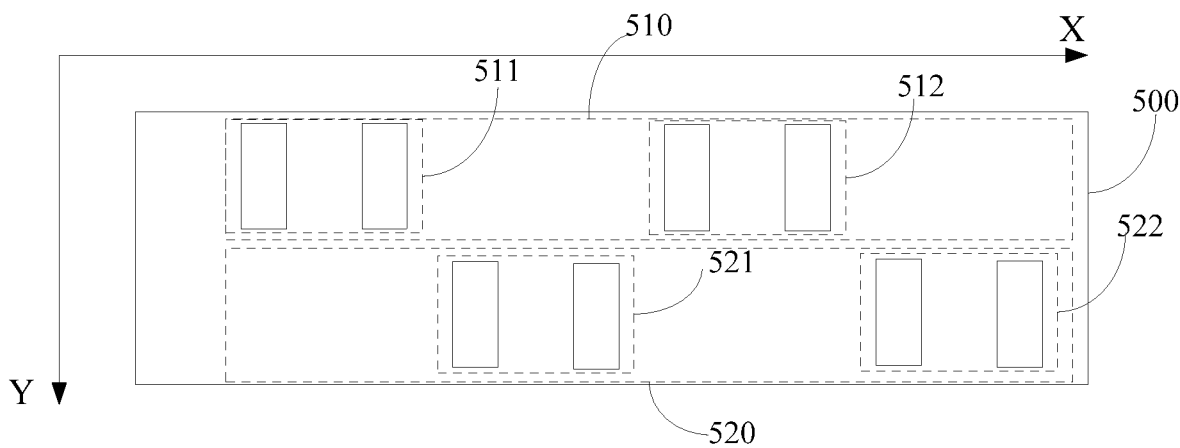
FIG. 5 schematically illustrates an arrangement of bond pads on an IC chip according to another embodiment of the present invention.

FIG. 5 schematically illustrates an arrangement of bond pads on an IC chip according to another embodiment of the present invention.

In the embodiment of FIG. 5, the arrangement on an IC chip 500 may include a first row of bond pads 510 and a second row of bond pads 520. The first row of bond pads 510 and the second row of bond pads 520 each includes at least one group of bond pads, and each group of bond pads contains at least one bond pad. Additionally, the at least one group of bond pads in the first row of bond pads 510 are positioned alternately with the at least one group of bond pads in the second row of bond pads 520.

In the embodiment of FIG. 5, for example, the first row of bond pads 510 include a first group of bond pads 511 and a second group of bond pads 512. The second row of bond pads 520 include a third group of bond pads 521 and a fourth group of bond pads 522.

It is to be noted that the numbers of groups in the first row of bond pads 510 and the second row of bond pads 520 are not limited and may be determined depending on the actual numbers of functional pins or interfaces of the IC chip.

With further reference to FIG. 5, the first and the second groups of bond pads 511 and 512 in the first row of bond pads 510 are positioned alternately with the third and the fourth groups of bond pads 521 and 522 in the second row of bond pads 520, such that, the groups of bond pads in the first row 510 (e.g., the groups 511 and 512) and the groups of bond pads in the second row 520 (e.g., the groups 521 and 522) do not align with each other along a direction (e.g., Y direction) perpendicular to the direction of the rows (e.g., X direction).

In the embodiment of FIG. 5, each of the groups contains, but not limited to, two bond pads. The number of bond pads in each group may be adjusted according to the real needs and may be same or different.

Figure 6:
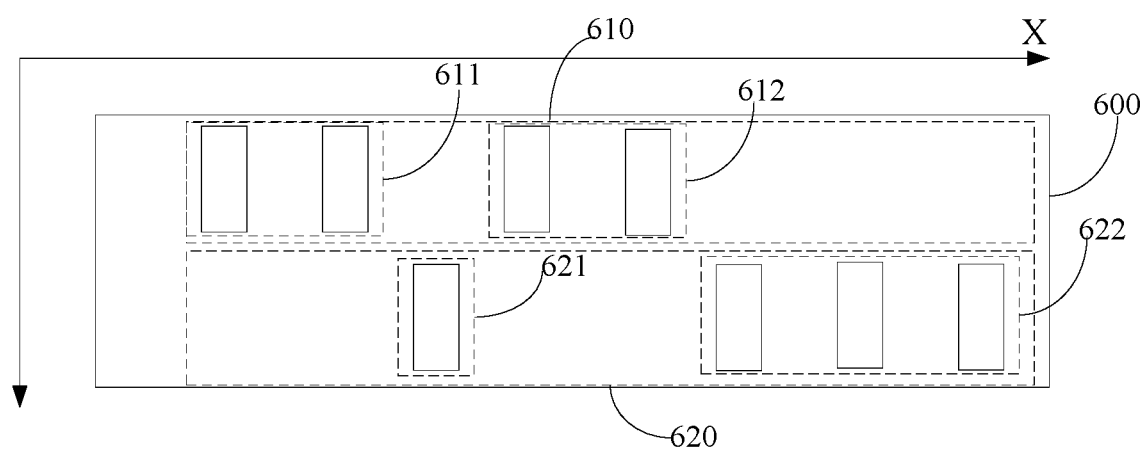
FIG. 6 schematically illustrates an arrangement of bond pads on an IC chip according to another embodiment of the present invention.

As an example shown in FIG. 6, an arrangement of bond pads on an IC chip 600 according to another embodiment of the present invention may include a first row of bond pads 610 including a first group of bond pads 611 and a second group of bond pads 612 and a second row of bond pads 620 including a third group of bond pads 621 and a fourth group of bond pads 622. Different from FIG. 5, in this embodiment, the third group of bond pads 621 contains one bond pad while the fourth group of bond pads 622 contains three bond pads.

Figure 7:
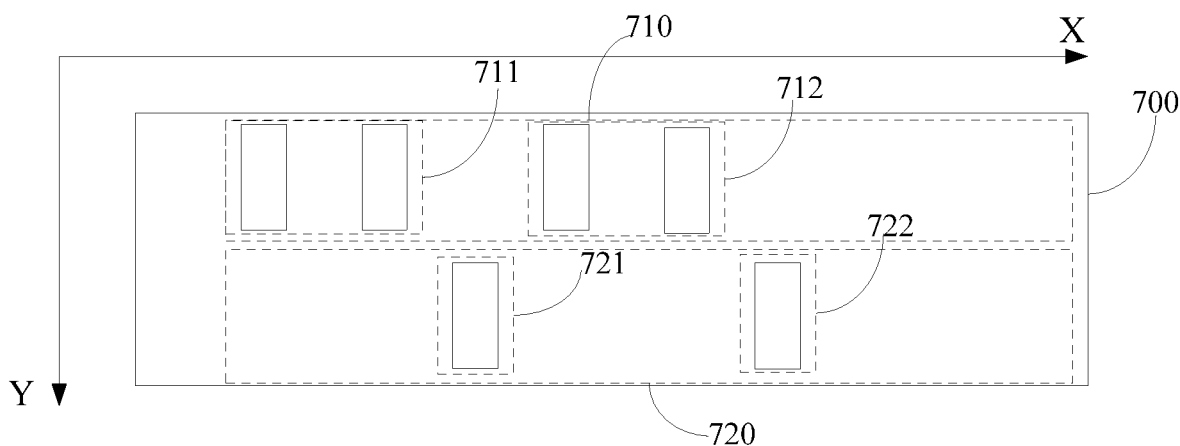
FIG. 7 schematically illustrates an arrangement of bond pads on an IC chip according to a further embodiment of the present invention.

As another example shown in FIG. 7, an arrangement of bond pads on an IC chip 700 according to another embodiment of the present invention may include a first row of bond pads 710 including a first group of bond pads 711 and a second group of bond pads 712 and a second row of bond pads 720 including a third group of bond pads 721 and a fourth group of bond pads 722. Different from FIG. 6, in this embodiment of the present invention, the fourth group of bond pads 722 contains one bond pad.

Figure 8:
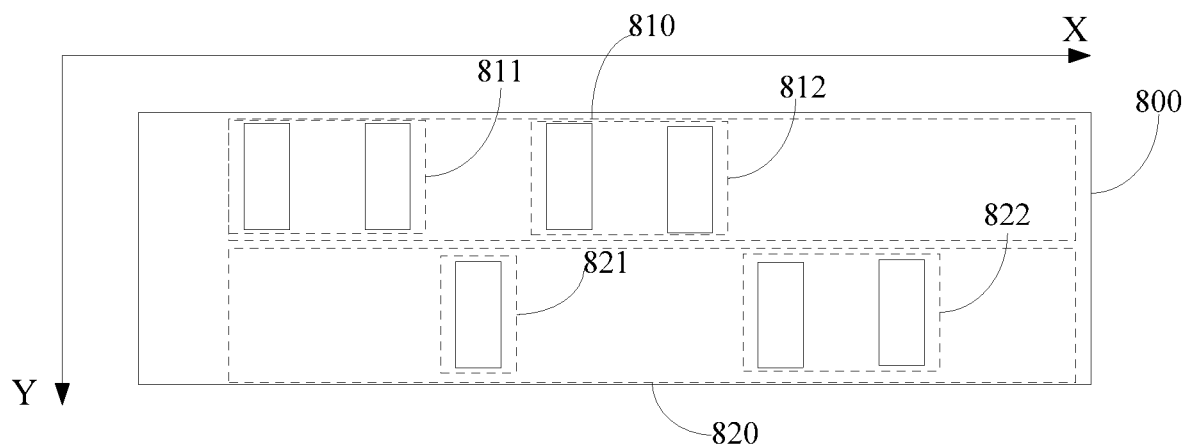
FIG. 8 schematically illustrates an arrangement of bond pads on an IC chip according to a further embodiment of the present invention.

As another example shown in FIG. 8, an arrangement of bond pads on an IC chip 800 according to another embodiment of the present invention may include a first row of bond pads 810 including a first group of bond pads 811 and a second group of bond pads 812 and a second row of bond pads 820 including a third group of bond pads 821 and a fourth group of bond pads 822. Different from FIG. 6, in the embodiment of the present invention, the fourth group of bond pads 822 contains two bond pads.

In an embodiment of the present invention, each of the groups may contain one bond pad, as shown in the embodiment of FIG. 3.

In an embodiment of the present invention, at least one group of bond pads in the second row of bond pads is positioned on a midline of two neighboring groups of bond pads in the first row of bond pads.

In the embodiment of FIG. 3, as an example, the third group of bond pads including the bond pad 321 in the second row of bond pads 320 is positioned on a midline L of two neighboring groups of bond pads in the first row of bond pads 310, i.e., the first group of bond pads including the bond pad 311 and the second group of bond pads including the bond pad 312. It is to be noted that the midline L refers here to a vertical line passing through a center of a line segment connecting centers of the two adjacent groups of bond pads in the first row of bond pads. That is, the midline is parallel to the Y-axis. In other words, the horizontal distance between the centers of the third group of bond pads including the bond pad 321 and the first group of bond pads including the bond pad 311 is equal to the horizontal distance between the centers of the third group of bond pads including the bond pad 321 and the second group of bond pads including the bond pad 312.

However, the present invention is not limited thereto. In other embodiments of the present invention, it is also possible that at least one group of bond pads in the second row of bond pads is located at any position between the two groups of bond pads in the first row of bond pads. For example, the horizontal distance between the centers of the third group of bond pads including the bond pad 321 and the first group of bond pads including the bond pad 311 may be greater than the horizontal distance between the centers of the third group of bond pads including the bond pad 321 and the second group of bond pads including the bond pad 312. Alternatively, the horizontal distance between the centers of the third group of bond pads including the bond pad 321 and the first group of bond pads including the bond pad 311 may be smaller than the horizontal distance between the centers of the third group of bond pads including the bond pad 321 and the second group of bond pads including the bond pad 312.

In an embodiment of the present invention, at least one of the bond pads may have at least one rounded corner.

In an embodiment of the present invention, the rounded corner may either be convex and/or concave. This will be described below with reference to FIGS. 9 to 12.

Figure 9:
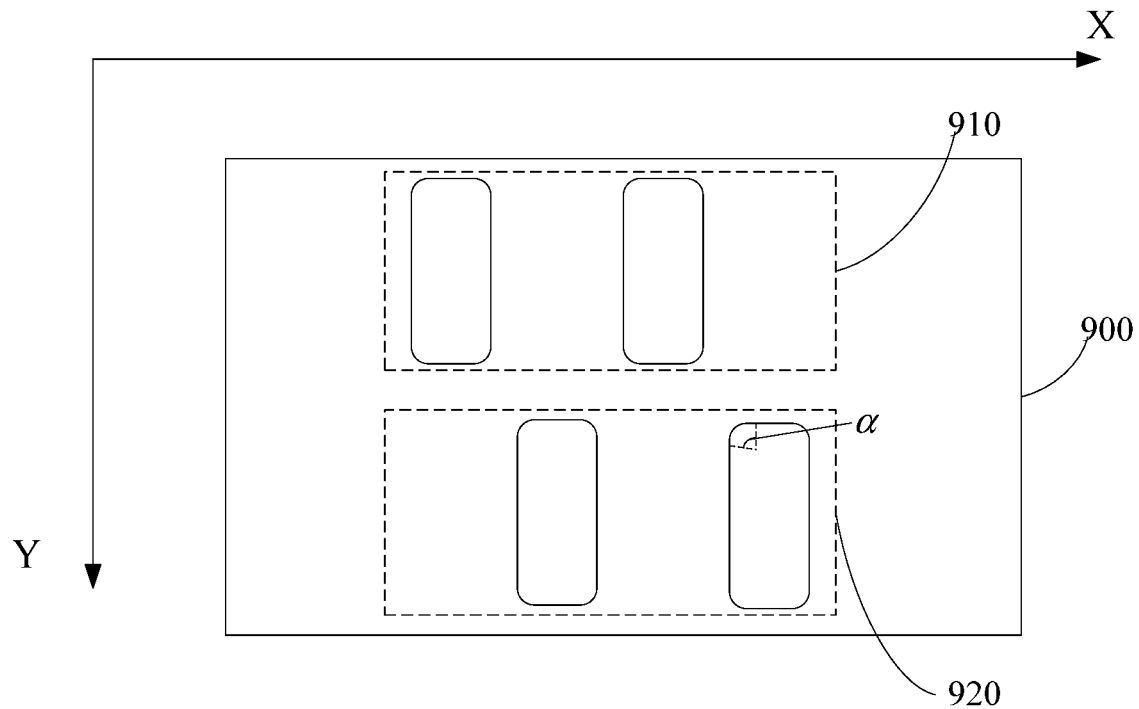
FIG. 9 schematically illustrates an arrangement of bond pads on an IC chip according to a further embodiment of the present invention.

FIG. 9 schematically illustrates an arrangement of bond pads on an IC chip according to a further embodiment of the present invention.

As shown in FIG. 9, an IC chip 900 may have a surface on which a first row of bond pads 910 and a second row of bond pads 920 are arranged. Different from the above embodiments, each of the bond pads in the rows of bond pads may have at least one rounded corner, e.g., four rounded corners.

In an embodiment of the present invention, the at least one rounded corner may have a central angle $\alpha$ that is greater than or equal to 30 degrees and less than 90 degrees.

As an example in the embodiment of FIG. 9, the rounded convex corners may have a central angle $\alpha$ of 60 degrees.

Figure 10:
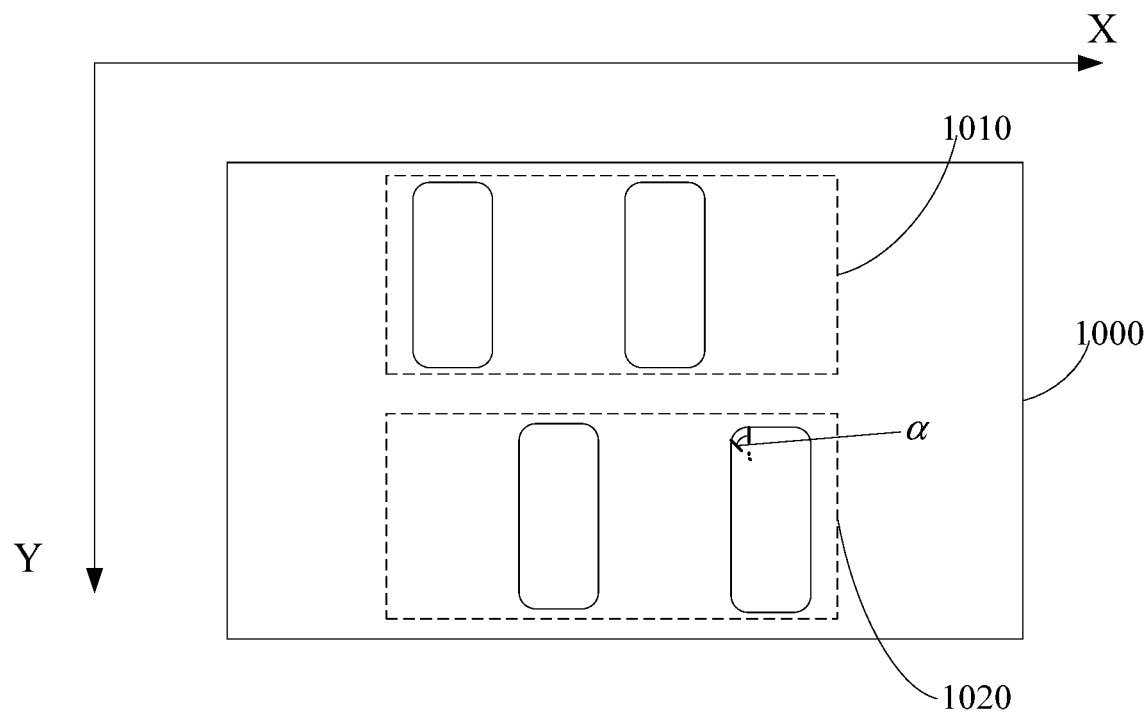
FIG. 10 schematically illustrates an arrangement of bond pads on an IC chip according to a further embodiment of the present invention.

As another example as shown in the embodiment of FIG. 10, an IC chip 1000 has a surface on which a first row of bond pads 1010 and a second row of bond pads 1020 are arranged, and each of these bond pads may have rounded convex corners having a central angle $\alpha$ of 30 degrees.

Figure 11:
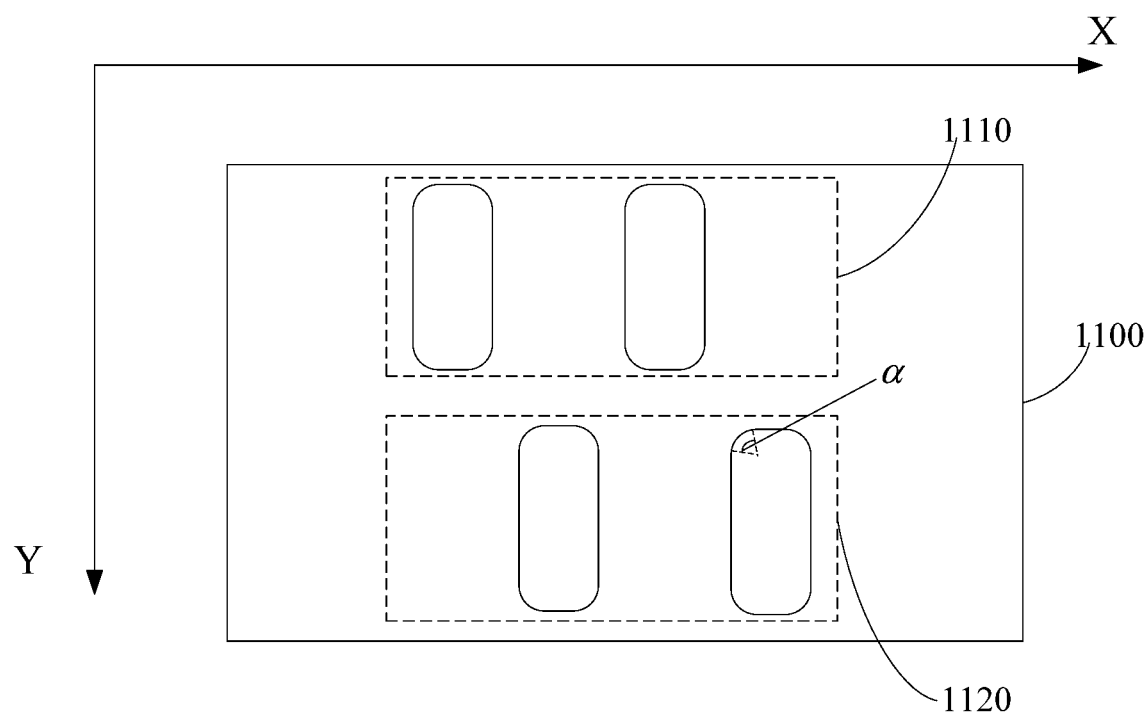
FIG. 11 schematically illustrates an arrangement of bond pads on an IC chip according to a further embodiment of the present invention.

As another example as shown in an embodiment of FIG. 11, an IC chip 1100 has a surface on which a first row of bond pads 1110 and a second row of bond pads 1120 are arranged, and each of these bond pads may have rounded convex corners having a central angle $\alpha$ of 45 degrees.

Figure 12:
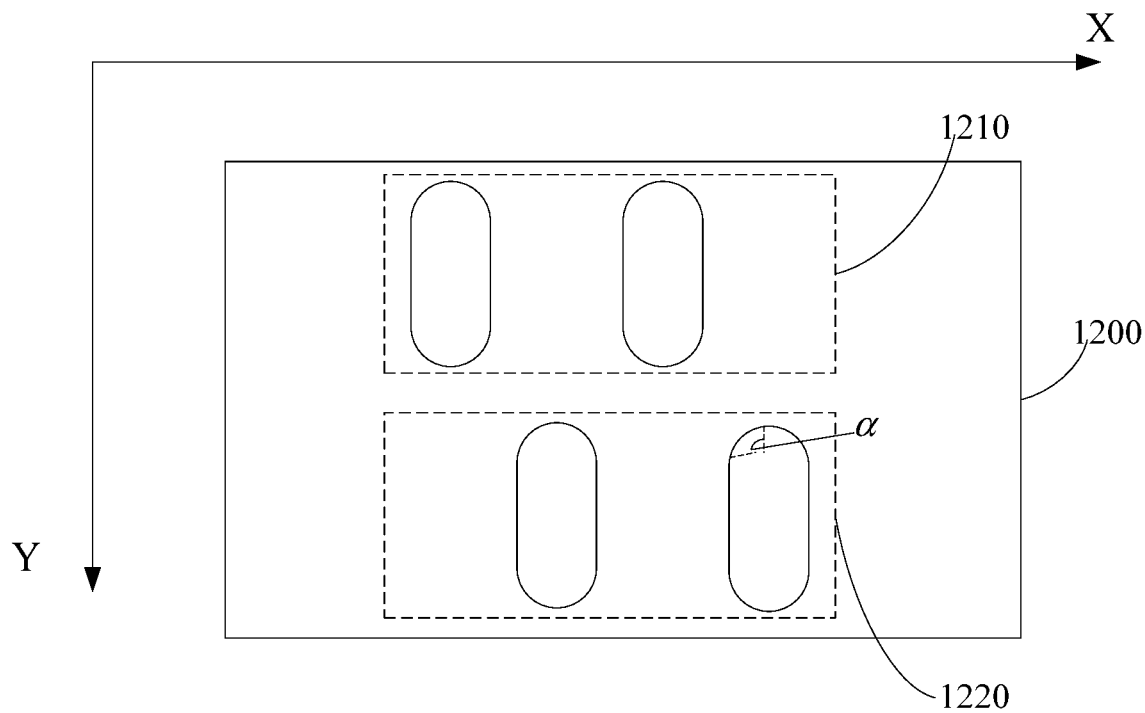
FIG. 12 schematically illustrates an arrangement of bond pads on an IC chip according to a further embodiment of the present invention.

As another example, as shown in an embodiment of FIG. 12, an IC chip 1200 has a surface on which a first row of bond pads 1210 and a second row of bond pads 1220 are arranged, and each of these bond pads may have rounded convex corners having a central angle $\alpha$ of 89 degrees.

However, the present invention is not limited thereto.

In the embodiments of FIGS. 9-12, each of the bond pads in the first and the second rows of bond pads has four rounded convex corners. Compared to the rectangular cornered bond pads in the relevant art, the four rounded convex corners of each bond pad according to the embodiments of the present invention can prevent unintended contact between different bond pads during the fabrication of the IC chip that may lead to a short circuit between them.

Figure 13:
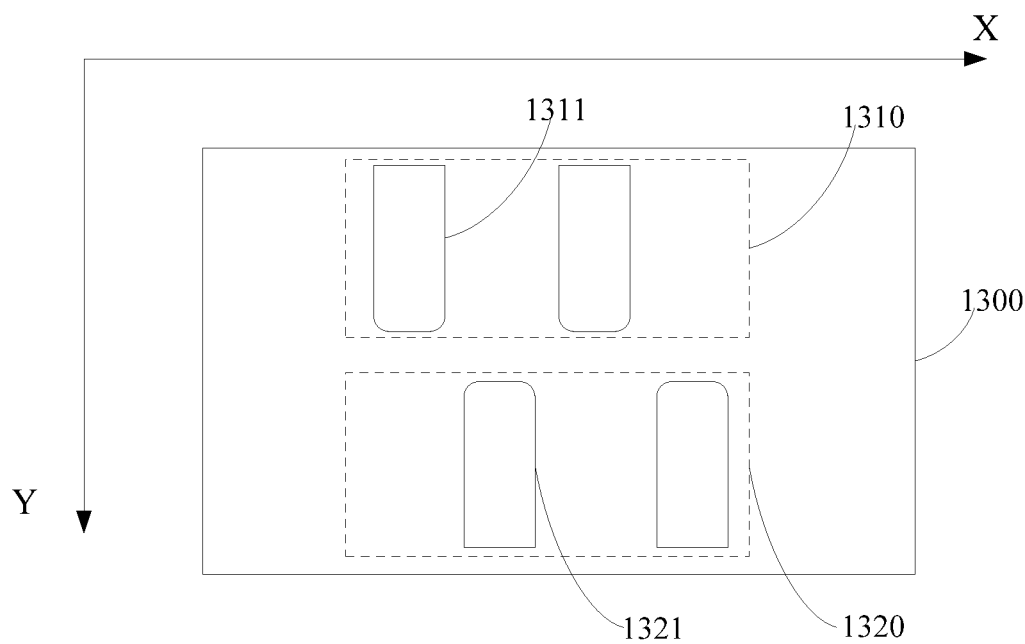
FIG. 13 schematically illustrates an arrangement of bond pads on an IC chip according to a further embodiment of the present invention.

FIG. 13 schematically illustrates an arrangement of bond pads on an IC chip according to a further embodiment of the present invention.

As shown in FIG. 13, an IC chip 1300 has a surface on which a first row of bond pads 1310 and a second row of bond pads 1320 are arranged.

In the embodiment of FIG. 13, each of the bond pads in the first and the second rows of bond pads 1310 and 1320 has two rounded convex corners. And the convex corners are located on a side of bond pads of the first row of bond pads adjacent to the second row of bond pads, or located on a side of bond pads of the second row of bond pads adjacent to the first row of bond pads. For example, but not limited to, the two rounded corners of the bond pad 1311 are located on its fourth side and two rounded corners of the bond pad 1321 on located on its third side. Compared to the rectangular-corner bond pads in the relevant art, the two rounded convex corners of each bond pad according to the embodiments of the present invention can prevent unintended contact between different bond pads during the fabrication of the IC chip that may lead to a short circuit between them.

Figure 14:
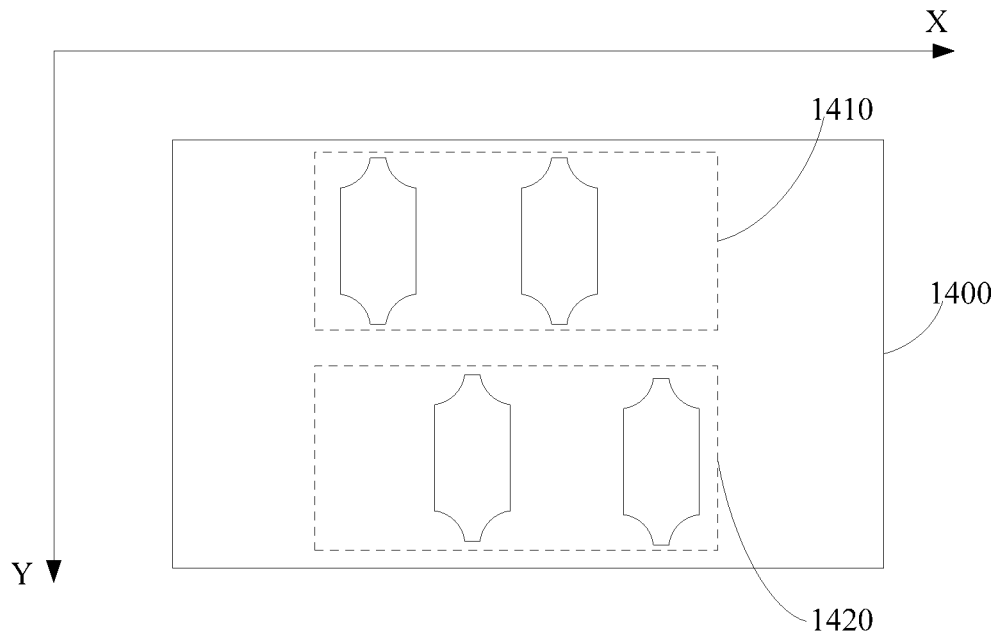
FIG. 14 schematically illustrates an arrangement of bond pads on an IC chip according to a further embodiment of the present invention.

FIG. 14 schematically illustrates an arrangement of bond pads on an IC chip according to a further embodiment of the present invention.

As shown in FIG. 14, an IC chip 1400 has a surface on which a first row of bond pads 1410 and a second row of bond pads 1420 are arranged.

This embodiment differs from that of FIG. 9, such that each of the bond pads have four rounded concave corners.

Figure 15:
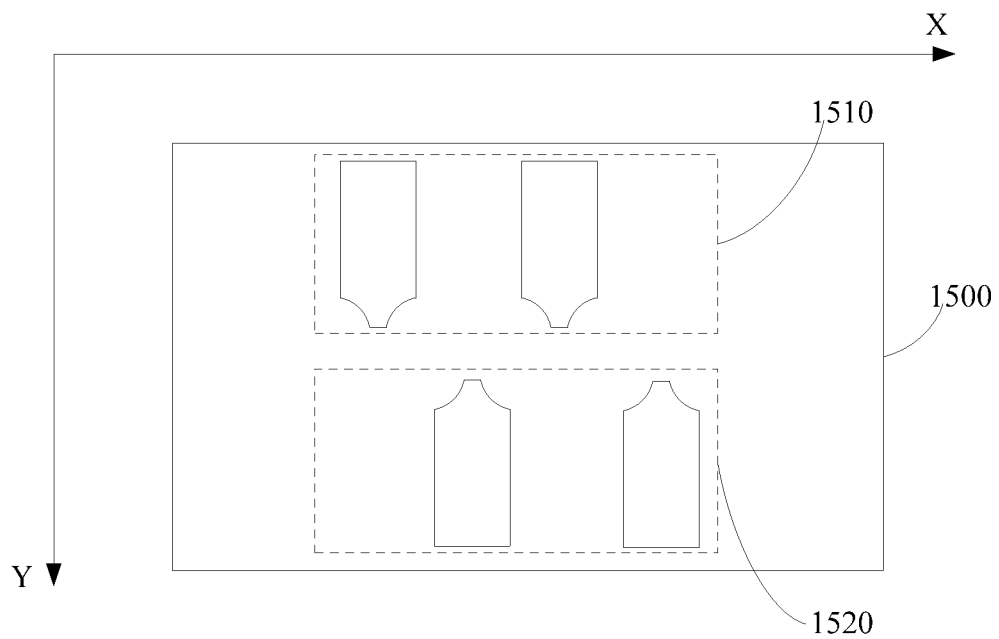
FIG. 15 schematically illustrates an arrangement of bond pads on an IC chip according to a further embodiment of the present invention.

FIG. 15 schematically illustrates an arrangement of bond pads on an IC chip according to a further embodiment of the present invention.

In the embodiment of FIG. 15, the IC chip 1500 has a surface on which a first row of bond pads 1510 and a second row of bond pads 1520 are arranged, and each of the bond pads has two rounded concave corners. Additionally, the concave corners are on a side of bond pads of the first row of bond pads 1510 adjacent to the second row of bond pads 1520, or located on a side of bond pads of the second row of bond pads 1520 adjacent to the first row of bond pads 1510.

Figure 16:
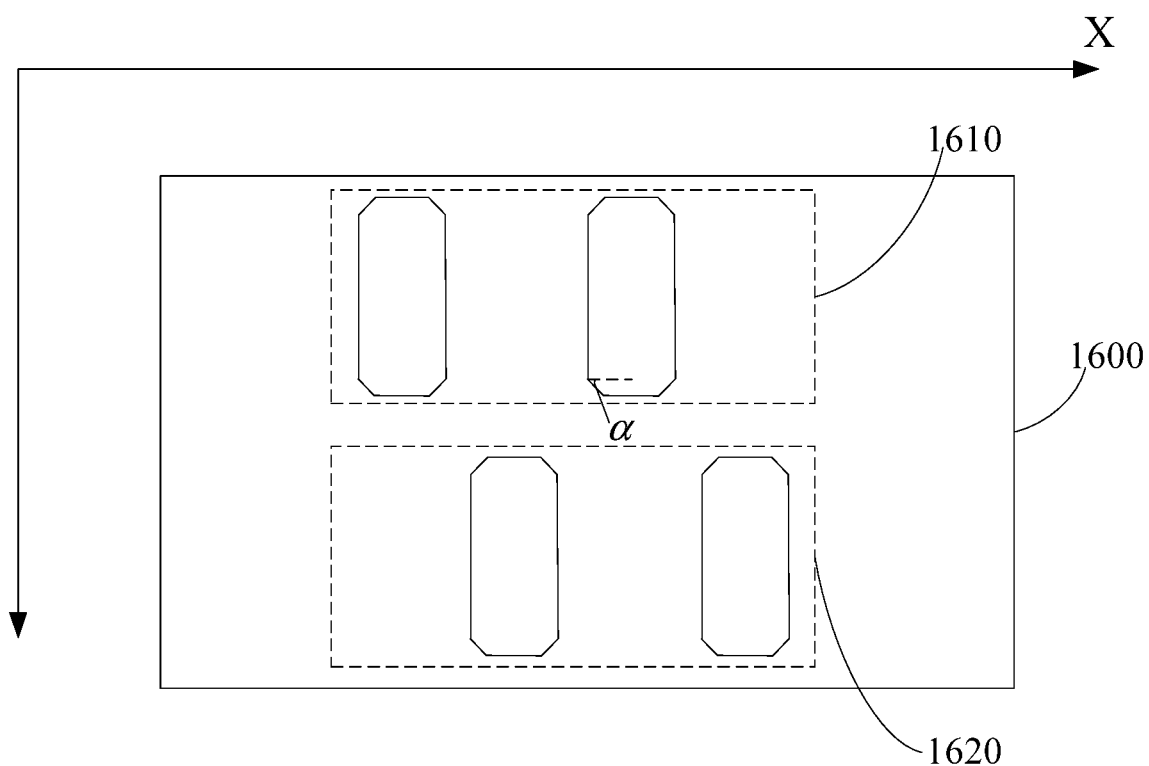
FIG. 16 schematically illustrates an arrangement of bond pads on an IC chip according to a further embodiment of the present invention.

FIG. 16 schematically illustrates an arrangement of bond pads on an IC chip according to a further embodiment of the present invention.

In the embodiment of FIG. 16, the IC chip 1600 has a surface on which a first row of bond pads 1610 and a second row of bond pads 1620 are arranged, and each of the bond pads has at least a chamfered corner, e.g., four chamfered corners. However, the present invention is not limited thereto. Compared to the rectangular cornered bond pads in the relevant art, the four chamfered corners of each bond pad according to the embodiments of the present invention can prevent unintended contact between different bond pads during the fabrication of the IC chip that may lead to a short circuit between them.

In an embodiment of the present invention, the chamfered corners may have a chamfer angle $\beta$ greater than or equal to 30 degrees and less than 90 degrees. For example, the chamfer angle $\beta$ may be, but is not limited to, 60, 30, or 45 degrees.

For instance, in the embodiment of FIG. 16, the chamfered corners may have a chamfer angle $\beta$ of 45 degrees.

Figure 17:
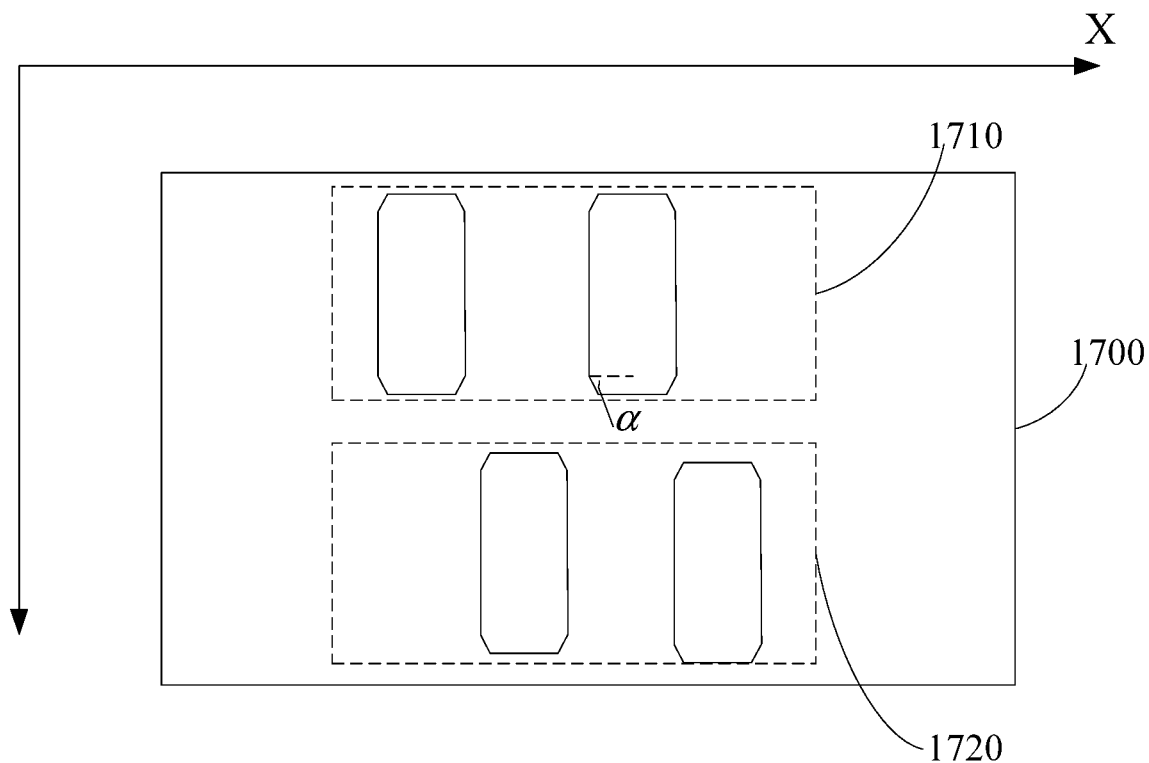
FIG. 17 schematically illustrates an arrangement of bond pads on an IC chip according to a further embodiment of the present invention.

As another example in an embodiment shown in FIG. 17, an IC chip 1700 has a surface on which a first row of bond pads 1710 and a second row of bond pads 1720 are arranged, and each of these bond pads may have chamfered corners $\beta$ of 60 degrees.

Figure 18:
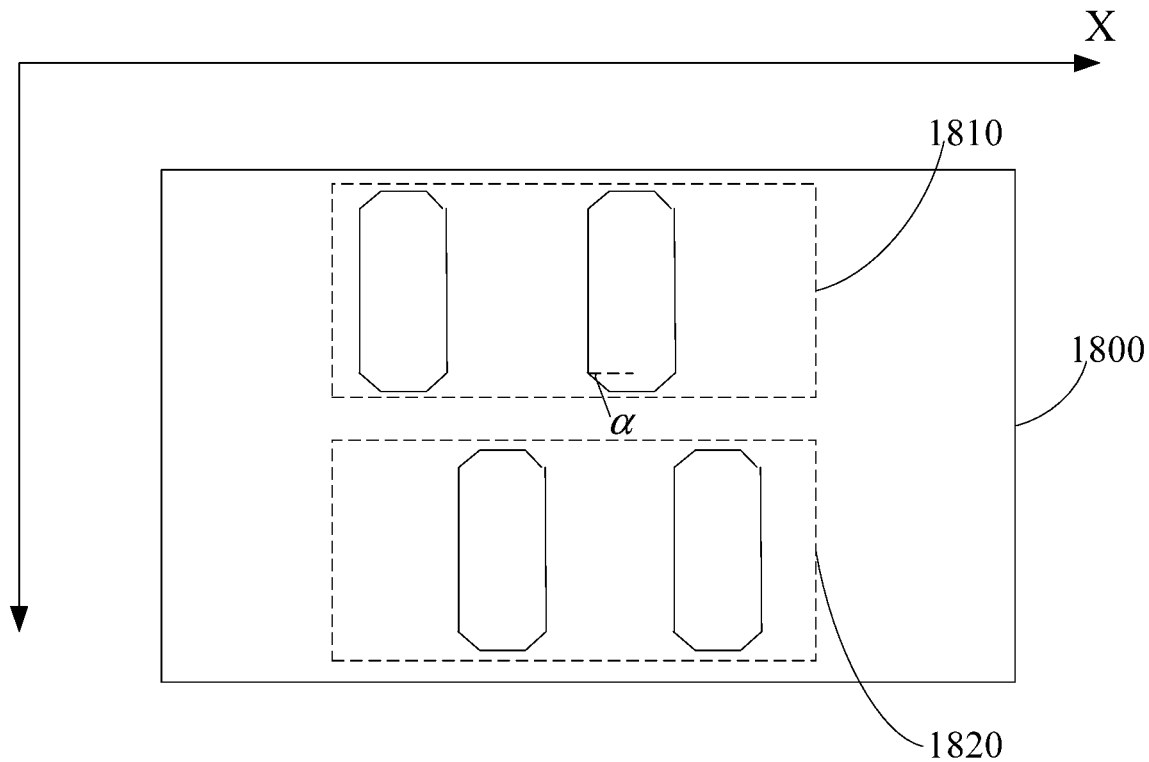
FIG. 18 schematically illustrates an arrangement of bond pads on an IC chip according to a further embodiment of the present invention.

As another example in an embodiment shown in FIG. 18, an IC chip 1800 has a surface on which a first row of bond pads 1810 and a second row of bond pads 1820 are arranged, and each of these bond pads may have chamfered corners $\beta$ of 30 degrees.

Figure 19:
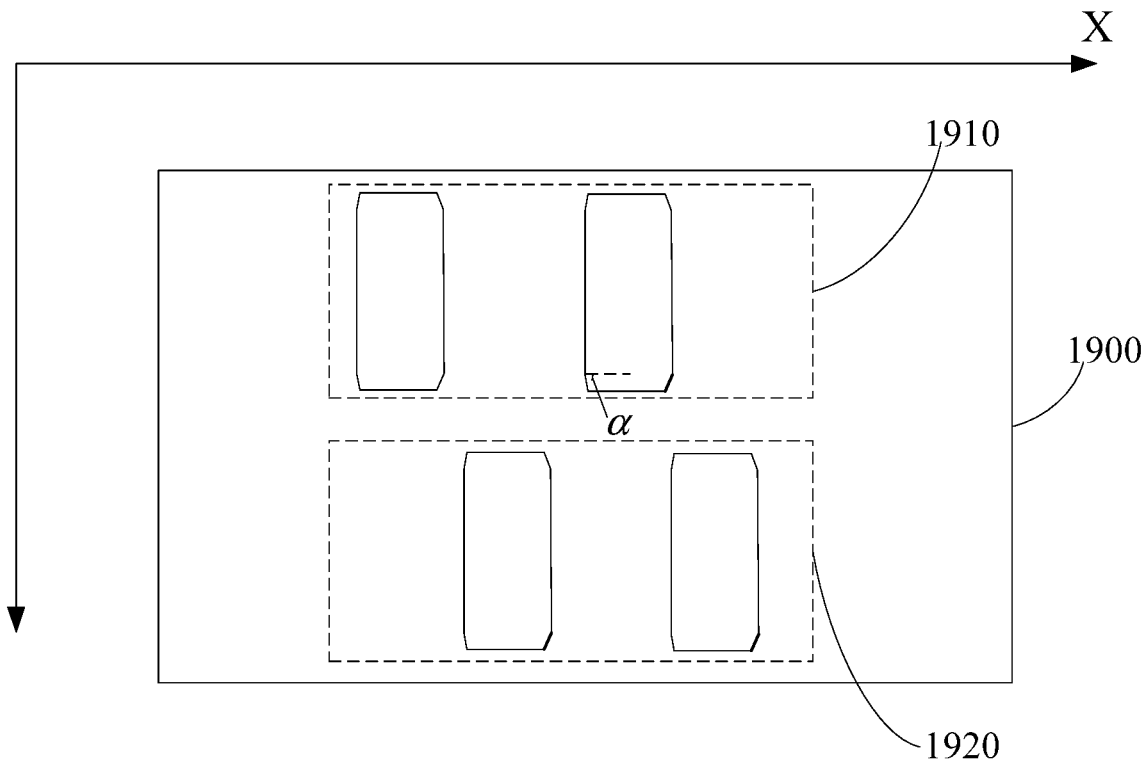
FIG. 19 schematically illustrates an arrangement of bond pads on an IC chip according to a further embodiment of the present invention.

As another example in an embodiment shown in FIG. 19, an IC chip 1900 has a surface on which a first row of bond pads 1910 and a second row of bond pads 1920 are arranged, and each of these bond pads may have chamfered corners $\beta$ of 89 degrees.

The embodiments of the present invention are not limited thereto.

In the embodiments of FIGS. 16-19, each of the bond pads in the first and the second rows of bond pads has four chamfered corners. Compared to the rectangular cornered bond pads in the relevant art, the four chamfered corners of each bond pad according to the embodiments of the present invention can prevent unintended contact between different bond pads during the fabrication of the IC chip that may lead to a short circuit between them.

Figure 20:
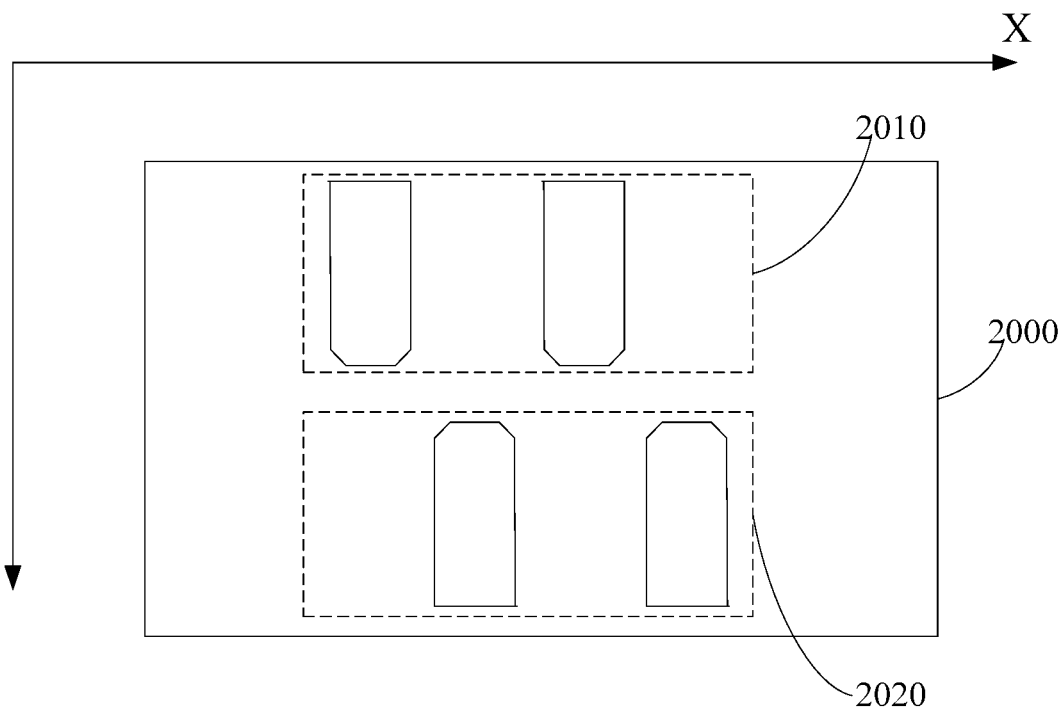
FIG. 20 schematically illustrates an arrangement of bond pads on an IC chip according to a further embodiment of the present invention.

FIG. 20 schematically illustrates an arrangement of bond pads on an IC chip according to a further embodiment of the present invention.

In the embodiment of FIG. 20, the IC chip 2000 has a surface on which a first row of bond pads 2010 and a second row of bond pads 2020 are arranged, and each of the bond pads has two chamfered corners. Likewise, the corners on the third sides of bond pads of the first row of bond pads and the corners on the fourth sides of bond pads of the second row of bond pads may be chamfered, and the other corners remain rectangular.

It is to be noted that, in other embodiments of the present invention, it is possible that each bond pad of the first row of bond pads has at least one rounded convex corner, and each bond pad of the second row of bond pads has at least one rounded concave or chamfered corner. Or each bond pad of the first row of bond pads has at least one rounded concave or chamfered corner, and each bond pad of the second row of bond pads has at least one rounded convex corner, etc. That is, the above embodiments may be combined to produce new embodiments which still fall in the scope of the present invention, which may not be described in detail herein.

Although embodiments of the on-IC chip bond pad arrangement proposed in this disclosure have been described and/or illustrated in detail above, embodiments of the disclosure are not limited to these particular ones disclosed herein. Rather, components and/or steps of each embodiment may be used independently and separately from other components and/or steps described herein, and each component and/or step of a certain embodiment may be used in combination with other components and/or steps of other embodiments. When used to introduce an element/component/etc. described and/or illustrated herein, the terms "a", "an", "the" and the like are intended to mean there are one or more such elements/components/etc. As used herein, the terms "comprising", "including" and "having" are intended to be used in an open-ended sense to mean that there are possibly other element(s)/component(s)/etc. apart from the listed element(s)/component(s)/etc. As used in the specification or the appended claims, the terms "first", "second", etc. are meant as labels rather than place a quantitative limitation upon the amount of the mentioned items.

While the on-IC chip bond pad arrangement proposed in this invention has been described with reference to various particular embodiments, those skilled in the art will recognize that modifications to the embodiments are possible within the principle and scope of the claims.

What is claimed is:

1. An integrated circuit chip, comprising:
a first row of bond pads, wherein the first row of bond pads include a first group of bond pads and a second group of bond pads; and
a second row of bond pads, wherein the second row of bond pads include a third group of bond pads and a fourth group of bond pads, wherein the first group of bond pads and the second group of bond pads in the first row are positioned alternately with the third group of bond pads and the fourth group of bond pads in the second row, and a short side of the bond pads in the first row and the second row is parallel to a long side of the integrated circuit chip,
and wherein each of the first group, the second group, the third group, and the fourth group includes more than one bond pads.

2. The integrated circuit chip of claim 1, wherein
the integrated circuit chip comprises a first side and a second side that are parallel to a first direction and a third side and a fourth side that are parallel to a second direction, and lengths of the first side and the second side of the integrated circuit chip are greater than lengths of the third side and the fourth side of the integrated circuit chip; and
each bond pad in the first row and the second row comprises a first side and a second side that are parallel to the second direction and a third side and a fourth side that are parallel to the first direction, and lengths of the first side and the second side of each bond pad are greater than lengths of the third side and the fourth side of each bond pad.

3. The integrated circuit chip of claim 2, wherein the fourth side of the bond pads of the first row is spaced from the third side of the bond pads of the second row by a distance greater than or equal to a first threshold in the second direction.

4. The integrated circuit chip of claim 2, wherein neighboring pads in the first row of pads are spaced from each other by a distance greater than or equal to a second threshold in the first direction, and neighboring pads in the second row of pads are spaced from each other by a distance greater than or equal to the second threshold in the first direction.

5. The integrated circuit chip of claim 1, further comprising:
a third row of bond pads adjacent to the second row, wherein bond pads of the third row are positioned alternately with the bond pads of the second row.

6. The integrated circuit chip of claim 1, wherein at least one of the bond pads has at least one rounded corner.

7. The integrated circuit chip of claim 6, wherein the at least one rounded corner is located on a side of a bond pad of the first row adjacent to the second row, or located on a side of a bond pad of the second row adjacent to the first row.

8. The integrated circuit chip of claim 6, wherein the at least one rounded corner has a central angle greater than or equal to 30 degrees and less than 90 degrees.

9. The integrated circuit chip of claim 1, wherein at least one of the bond pads has at least one chamfered corner.

10. The integrated circuit chip of claim 9, wherein the at least one chamfered corner is located on a side of a bond pad of the first row adjacent to the second row, or located on a side of a bond pad of the second row adjacent to the first row.

11. The integrated circuit chip of claim 9, wherein the at least one chamfered corner has a chamfer angle greater than or equal to 30 degrees and less than 90 degrees.

12. The integrated circuit chip of claim 1, wherein at least one corner of at least one of the bond pads includes one of a concave corner, a convex corner, or a chamfered corner.

13. The integrated circuit chip of claim 1, wherein a number of bond pads in the first row is the same as or different than a number of bond pads in the second row.

14. The integrated circuit chip of claim 1, wherein the first group of bond pads comprises a first number of bond pads, the second group of bond pads comprises a second number of bond pads, and the first number is the same as or different than the second number.

15. The integrated circuit chip of claim 1, wherein the third group of bond pads comprises a third number of bond pads, the fourth group of bond pads comprises a fourth number of bond pads, and the third number is the same as or different than the fourth number.

* * * * *